(12) United States Patent
Lam et al.

(10) Patent No.: US 8,638,598 B1
(45) Date of Patent: Jan. 28, 2014

(54) MULTI-BIT RESISTANCE MEASUREMENT

(71) Applicants: Chung H. Lam, Peekskill, NY (US); Jing Li, Ossining, NY (US); Robert K. Montoye, Rocheter, MN (US)

(72) Inventors: Chung H. Lam, Peekskill, NY (US); Jing Li, Ossining, NY (US); Robert K. Montoye, Rocheter, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/551,574

(22) Filed: Oct. 1, 2012

(51) Int. Cl.
*G11C 11/00* (2006.01)
(52) U.S. Cl.
USPC ............... 365/158; 365/148; 365/185.03
(58) Field of Classification Search
USPC .................... 365/158, 185.03, 149
See application file for complete search history.

(56) References Cited

U.S. PATENT DOCUMENTS

| | | | | |
|---|---|---|---|---|
| 6,813,177 | B2 | 11/2004 | Lowrey et al. | 365/148 |
| 6,816,796 | B2 | 11/2004 | Bierl | 702/57 |
| 7,203,096 | B2 * | 4/2007 | Borromeo et al. | 365/185.21 |
| 7,280,390 | B2 | 10/2007 | Kostylev et al. | 365/163 |
| 7,567,473 | B2 | 7/2009 | Breitwisch et al. | 365/203 |
| 7,602,631 | B2 | 10/2009 | Breitwisch et al. | 365/148 |
| 7,602,632 | B2 | 10/2009 | Breitwisch et al. | 365/148 |
| 7,778,064 | B2 | 8/2010 | Parkinson et al. | 365/148 |
| 2006/0221712 | A1 | 10/2006 | Lowrey et al. | 365/189.01 |
| 2008/0298114 | A1 | 12/2008 | Liu et al. | 365/148 |
| 2009/0303785 | A1 | 12/2009 | Hwang et al. | 365/163 |
| 2009/0323408 | A1 | 12/2009 | Taylor et al. | 365/163 |

OTHER PUBLICATIONS

G. W. Burr et al., "Phase change memory technology," Journal of Vacuum Science & Technology B: Microelectronics and Nanometer Structures, vol. 28, No. 2, 2010, pp. 223-262.

* cited by examiner

*Primary Examiner* — Anthan Tran
(74) *Attorney, Agent, or Firm* — Ido Touchman; Vazken Alexanian

(57) ABSTRACT

An example embodiment is a method for determining a binary value of a memory cell represented by an electrical resistance level of the memory cell. The method includes iteratively charging shunt capacitors having different capacitances until a selected shunt capacitor causes the voltage to decay through the memory cell to a reference voltage within a predetermined time range. A binary value of the most significant bits of the memory cell is determined based on the selected shunt capacitor. The selected shunt capacitor is then charged to a second voltage and the binary value of the least significant bits of the memory cell is determined based on a decay of the second voltage at the selected shunt capacitor through the memory cell.

8 Claims, 5 Drawing Sheets

MULTI-BIT RESISTANCE MEASUREMENT

BACKGROUND

The present invention is directed toward computer memory, and more particularly to determining a resistance level of a memory cell.

Typical semiconductor computer memories are fabricated on semiconductor substrates consisting of arrays of large number of physical memory cells. In general, one bit of binary data is represented as a variation of a physical parameter associated with a memory cell. Commonly used physical parameters include threshold voltage variation of the Metal Oxide Field Effect Transistor (MOSFET) due to the amount of charge stored in a floating gate or a trap layer in non-volatile Electrically Erasable Programmable Read Only Memory (EEPROM), resistance variation of the phase change memory element in Phase-change Random Access Memory (PRAM) or Ovonic Unified Memory (OUM), and charge storage variation in volatile Dynamic Random Access Memory (DRAM).

Increasing the number of bits stored in a single physical semiconductor memory cell is an effective method of lowering the manufacturing cost per bit. Multiple bits of data can also be stored in a single memory cell when variations of the physical parameter can be associated with multiple bit values. Such a multiple bits storage memory cell is commonly known as Multi-Level Cell (MLC). Significant effort in computer memory device and circuit designs is devoted to maximizing the number of bits to be stored in a single physical memory cell. This is particularly true with storage class memory such as popular non-volatile Flash memories commonly used as mass storage device.

The basic requirement for multiple bit storage in a semiconductor memory cell is to have the spectrum of the physical parameter variation to accommodate multiple non-overlapping bands of values. The number of bands required for an n-bit cell is $2^n$. A 2-bit cell needs 4 bands, a 3-bit cell needs 8 bands and so forth. Thus, the available spectrum of a physical parameter in a semiconductor memory cell is a limiting factor for multiple bit memory storage.

SUMMARY

One example of the invention is a method for determining a binary value of a memory cell. The binary value of the memory cell is represented by an electrical resistance level of the memory cell and includes most significant bits and least significant bits. The method includes iteratively charging shunt capacitors having different capacitances to a first voltage until a selected shunt capacitor causes the first voltage to decay through the memory cell to a first reference voltage within a predetermined time range. A binary value of the most significant bits of the memory cell is determined based on the selected shunt capacitor. The selected shunt capacitor is then charged to a second voltage after determining the binary value of the most significant bits of the memory cell. A binary value of the least significant bits of the memory cell is determined based on a decay of the second voltage at the selected shunt capacitor through the memory cell.

Another example of the invention is a circuit for determining a binary value of a memory cell. The circuit includes a plurality of shunt capacitors having different capacitances and configured to selectively couple with the memory cell. The circuit additionally includes a controller configured to iteratively charge the shunt capacitors to a first voltage until a selected shunt capacitor causes the first voltage to decay through the memory cell to a first reference voltage within a predetermined time range. The controller also determines a binary value of the most significant bits of the memory cell based on the selected shunt capacitor, charges the selected shunt capacitor to a second voltage after determining the binary value of the most significant bits of the memory cell, and determines a binary value of the least significant bits of the memory cell based on a decay of the second voltage at the selected shunt capacitor through the memory cell.

Yet another example of the invention is a computer program product for determining a binary value of a memory cell. The computer program product includes computer readable program code configured to iteratively charge shunt capacitors having different capacitances to a first voltage until a selected shunt capacitor causes the first voltage to decay through the memory cell to a first reference voltage within a predetermined time range, determine a binary value of the most significant bits of the memory cell based on the selected shunt capacitor, charge the selected shunt capacitor to a second voltage after determining the binary value of the most significant bits of the memory cell, and determine a binary value of the least significant bits of the memory cell based on a decay of the second voltage at the selected shunt capacitor through the memory cell.

DETAILED DESCRIPTION

Figure 1:
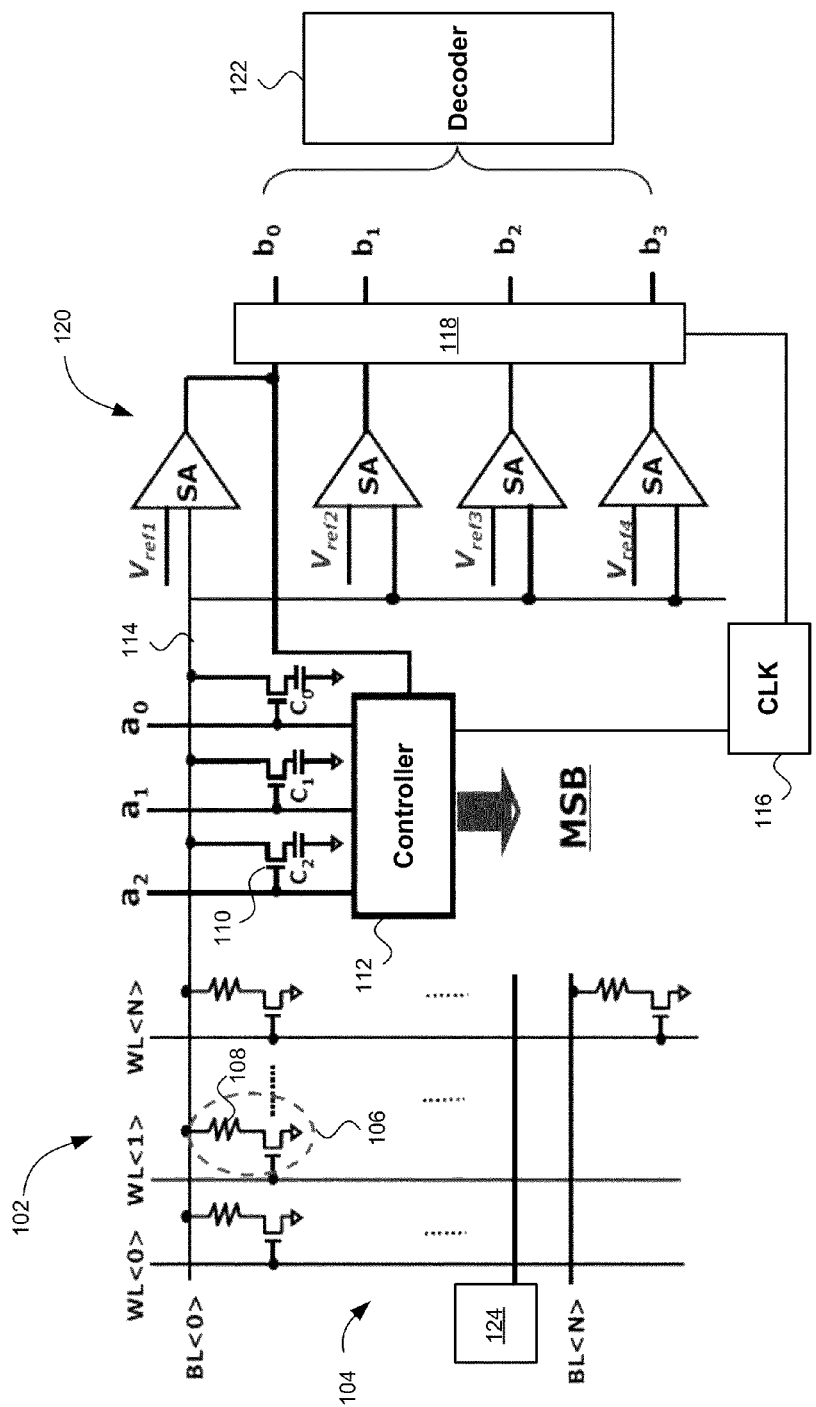
FIG. 1 shows an example embodiment of a circuit for determining a binary value of a memory cell, as contemplated by the present invention.

The present invention is described with reference to embodiments of the invention. Throughout the description of the invention reference is made to FIGS. 1-5. When referring to the figures, like structures and elements shown throughout are indicated with like reference numerals.

FIG. 1 shows an example embodiment of a circuit 102 for determining a binary value of a memory cell 106, as contemplated by the present invention. The system includes a memory array 104 for storing information. The memory array 104 includes a plurality of memory cells. Each memory cell can be programmed to a particular resistance level, which could be read at a later time. Thus, the memory array 104 generally uses the resistance of memory cells to represent binary data stored therein. In one embodiment, each memory cell can represent multiple bits of data by storing different resistance levels therein. Thus, the binary value of the memory cell 106 includes most significant bits (MSB) and least significant bits (LSB).

The circuit 102 includes a plurality of shunt capacitors ($C_1$, $C_2$, $C_3$) having different capacitances. In one embodiment, the ratio between each capacitance of the shunt capacitors has a logarithmic relation. The shunt capacitors are configured to selectively couple with the memory cell 106. For example, the circuit 102 may include an access transistor 110 at each shunt capacitor configured to electrically couple the memory cell 106 to a selected shunt capacitor.

As described in more detail below, the circuit 102 includes a controller 112 configured to iteratively charge the shunt capacitors to a first voltage. The iteration continues until a selected shunt capacitor causes the first voltage to decay through the memory cell 106 to a first reference voltage ($V_{ref}$) within a predetermined time range. The binary value of the most significant bits of the memory cell 106 is based on the selected shunt capacitor.

The controller 112 then charges the selected shunt capacitor to a second voltage after determining the binary value of the most significant bits of the memory cell. The binary value of the least significant bits of the memory cell 106 is determined based on a decay of the second voltage at the selected shunt capacitor through the memory cell 106. In one embodiment, the first voltage and the second voltage are equal.

The circuit may include a counter 114 configured to count clock pulses until the first voltage decays to the first reference voltage ($V_{ref}$). In one embodiment, the selected shunt capacitor is one of the shunt capacitors having the smallest capacitance that causes the counter to overflow. As used herein, the term overflow means the counter reaching its highest possible count value. In another embodiment, the selected shunt capacitor is one of the shunt capacitors having the smallest capacitance that causes the counter to underflow. As used herein, the term overflow means the counter remaining at its lowest possible count value.

Figure 2:
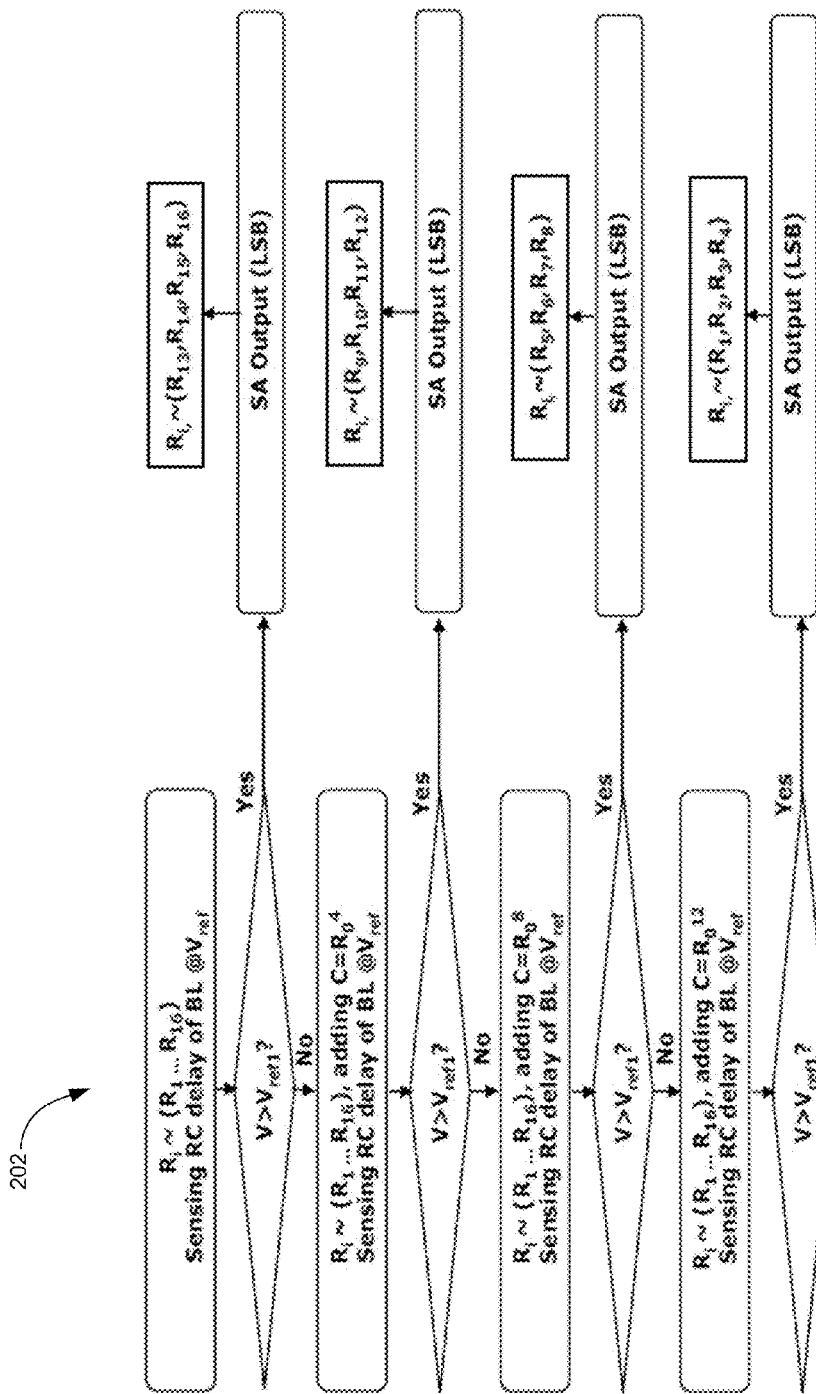
FIG. 2 shows an example process flow for determining the two most significant bits of a four bit memory cell by detecting counter overflows.

FIG. 2 shows an example process flow for determining the two most significant bits of a four bit memory cell by detecting counter overflows. The counter uses a fast clock signal and is designed to overflow at $t=R_0{}^{16}C*(\log V_{BL}(0) - \log V_{ref})$, where $V_{BL}(0)$ is the first voltage the shunt capacitors are initially charged to. The process flow ignores counter underflows.

Figure 3:
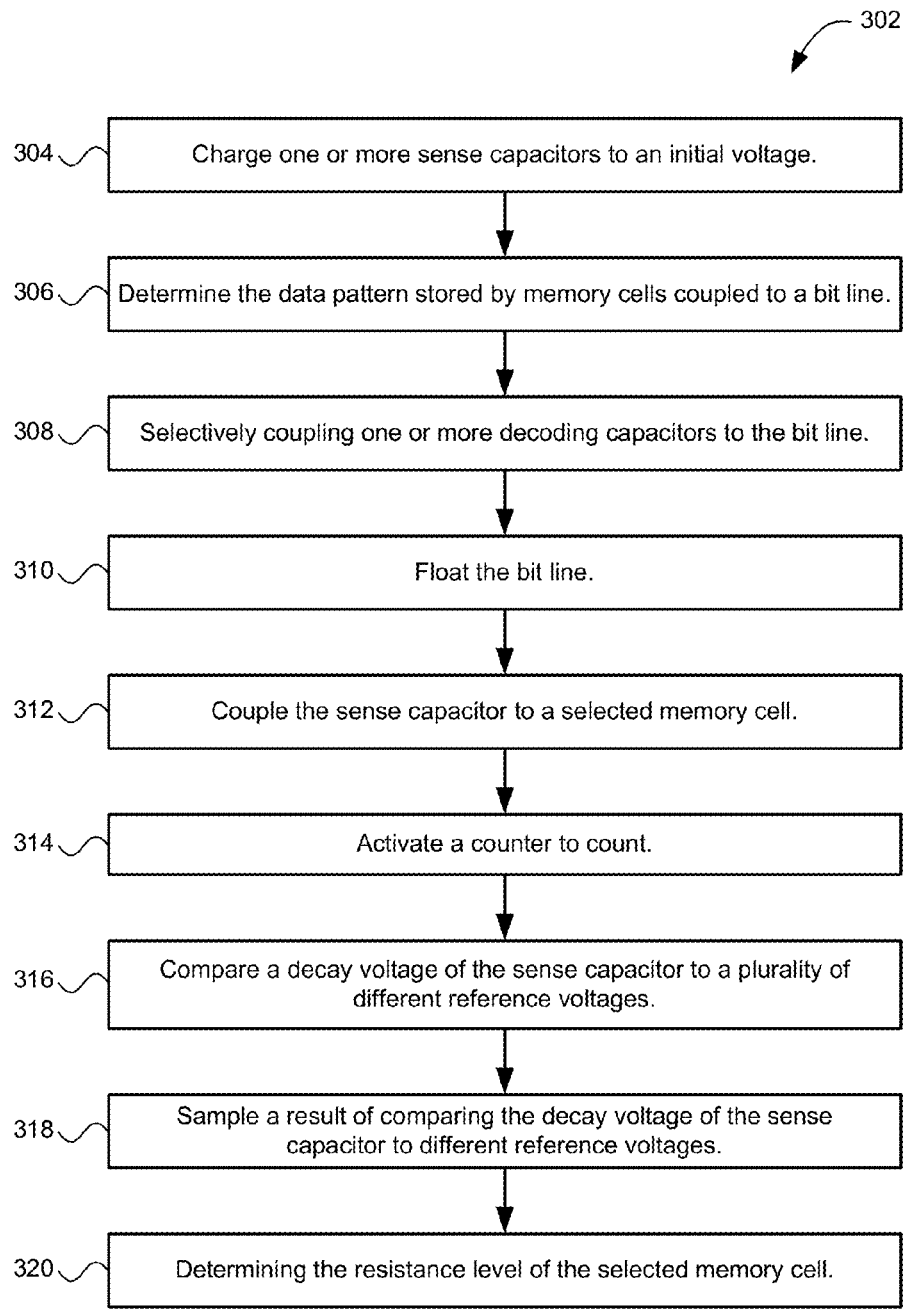
FIG. 3 shows an example process flow for determining the two most significant bits of a four bit memory cell by detecting counter underflows.

FIG. 3 shows an example process flow for determining the two most significant bits of a four bit memory cell by detecting counter underflows. The counter uses a slow clock signal. The process flow ignores counter overflows.

Turning back to FIG. 1, in one embodiment, the binary value of the least significant bits of the memory cell 106 is based on a time of decay from the second voltage to the second reference voltage ($V_{ref}$). The counter 114 is configured to count clock pulses in a binary clock pulse count 116 until the second voltage decays to the second reference voltage. In a particular embodiment, the binary value of the least significant bits is based solely on the position of the highest digit of the binary clock pulse count, as shown in the table below.

TABLE 1

Counter Decoding Scheme

| Counter Output ($b_3b_2b_1b_0$) | Sensing Output (LSB) |
|---|---|
| 0001 | 00 |
| 001x | 01 |
| 01xx | 10 |
| 1xxx | 11 |

Figure 4:
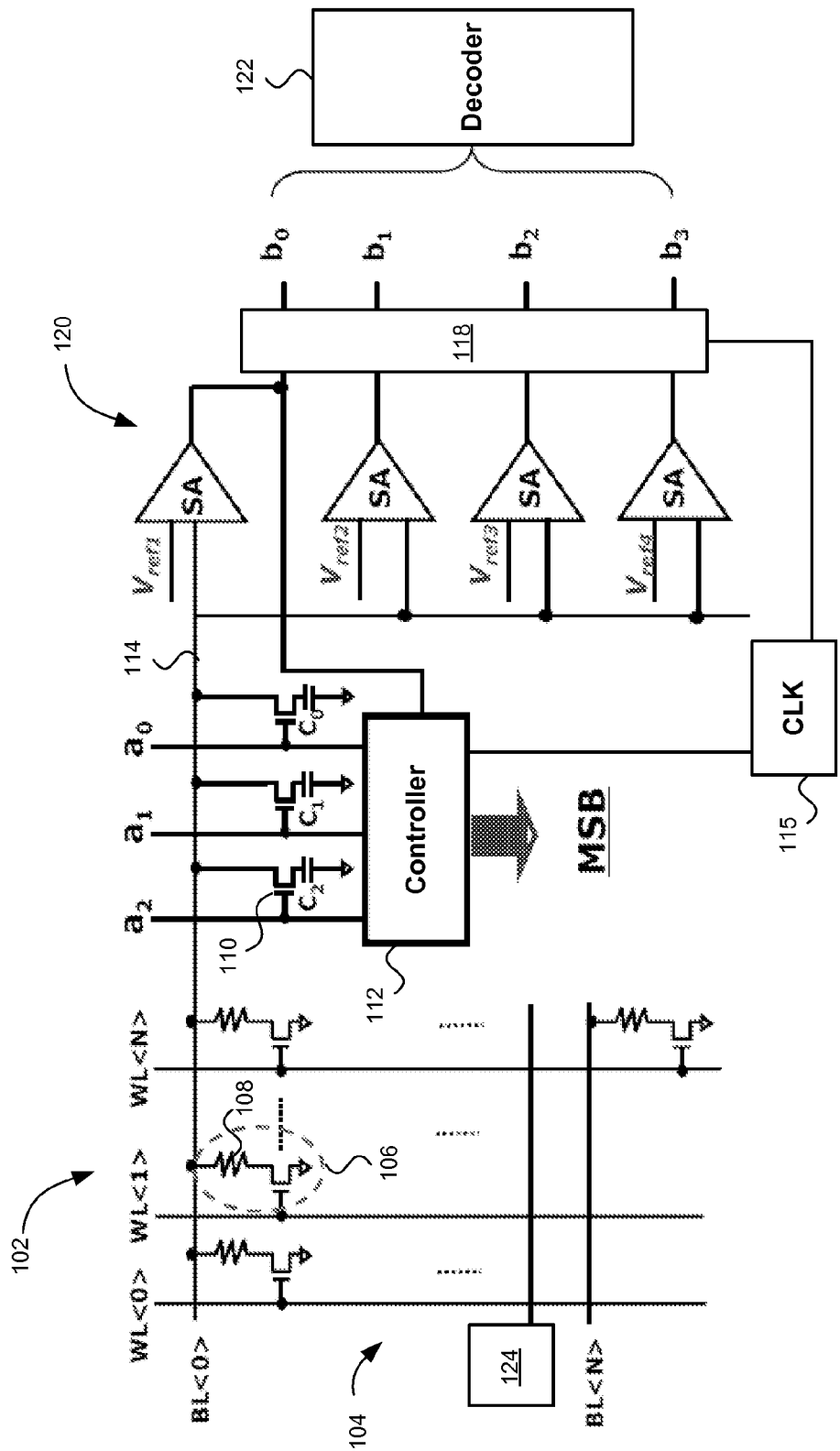
FIG. 4 shows another example embodiment of a circuit for determining the binary value of the memory cell.

FIG. 4 shows another example embodiment of the circuit 102 for determining the binary value of the memory cell 106. The selected memory cell includes phase change material 108 programmable to one of a plurality of resistance levels.

The circuit 102 includes a plurality of comparators 120. Each of the comparators 120 is coupled to a different voltage reference ($V_{ref1}$, $V_{ref2}$, $V_{ref3}$ and $V_{ref4}$). Furthermore, the access transistor 110 is configured to electrically couple the memory cell 106 to the selected shunt capacitor and the comparators 120. Additionally, the binary value of the least significant bits of the memory cell is based on outputs of the comparators at a predetermined time.

The circuit 102 is configured to compare a decay voltage 114 of a selected shunt capacitor to the plurality of different reference voltages $V_{ref1}$-$V_{ref4}$ at a predetermined time after coupling the selected shunt capacitor with the memory cell 106. Additionally, the controller 112 may be configured to determining the least significant bits the selected memory cell 106 based on which of the reference voltages $V_{ref1}$-$V_{ref4}$ are above the decay voltage 114 and which of the reference voltages $V_{ref1}$-$V_{ref4}$ are below the decay voltage 114.

In one embodiment, the controller 112 is configured to charge the selected shunt capacitor to a second voltage $V_0$ before the shunt capacitor discharges through the memory cell 106. Thus, the decay voltage of the sense capacitor over time is approximately equal to an RC decay of $V_0 \exp(-t/RC)$. Furthermore, different resistance levels of the selected memory cell result in different RC decay speeds.

In one embodiment, the resistance decay speeds can be differentiated by sensing various RC delays on bit lines BL<0>-BL<N>. In one embodiment, a clock signal 115 is configured to trigger a sampling circuit 118 at a predetermined time. The sampling circuit 118 samples a result of the compared decay voltage 114 to the plurality of different reference voltages $V_{ref1}$-$V_{ref4}$ when the clock signal 115 reaches a predetermined time.

The least significant bits (LSB) of the resistance level are determined from the sense amplifier outputs ($b_3b_2b_1b_0$). For example, the decay voltage 114 can be compared to four different reference voltage levels. The number of reference voltages can be selected in various ways, depending on the application. The circuit 102 may include a decoder 122 configured to convert the output of the sense amplifiers 120 into a binary value. Table 2 illustrates an example decoding scheme contemplated by the invention. In one implementation, the bit line voltage is triggered at a falling edge of clock signal and is compared with the various voltage levels.

TABLE 2

Sense Amp Decoding Scheme

| SA Output ($V_{ref1}<V_{ref2}<V_{ref3}<V_{ref4}$) | Sensing Output (LSB) |
|---|---|
| $V_{ref1} < V < V_{ref2}$ | 0001 (00) |
| $V_{ref2} < V < V_{ref3}$ | 0011 (01) |
| $V_{ref3} < V < V_{ref4}$ | 0111 (10) |
| $V_{ref4} < V$ | 1111 (11) |

The circuit 102 may include one or more decoding capacitors 124 selectively coupled to the bit line such that the capacitance of the decoding capacitors 124 substantially offsets a bit line capacitance of the memory cells coupled to the bit line. In this manner, the decoding capacitors 124 compensate for the bit line capacitance due to the data patterns stored in each cell on the same bit line.

Figure 5:
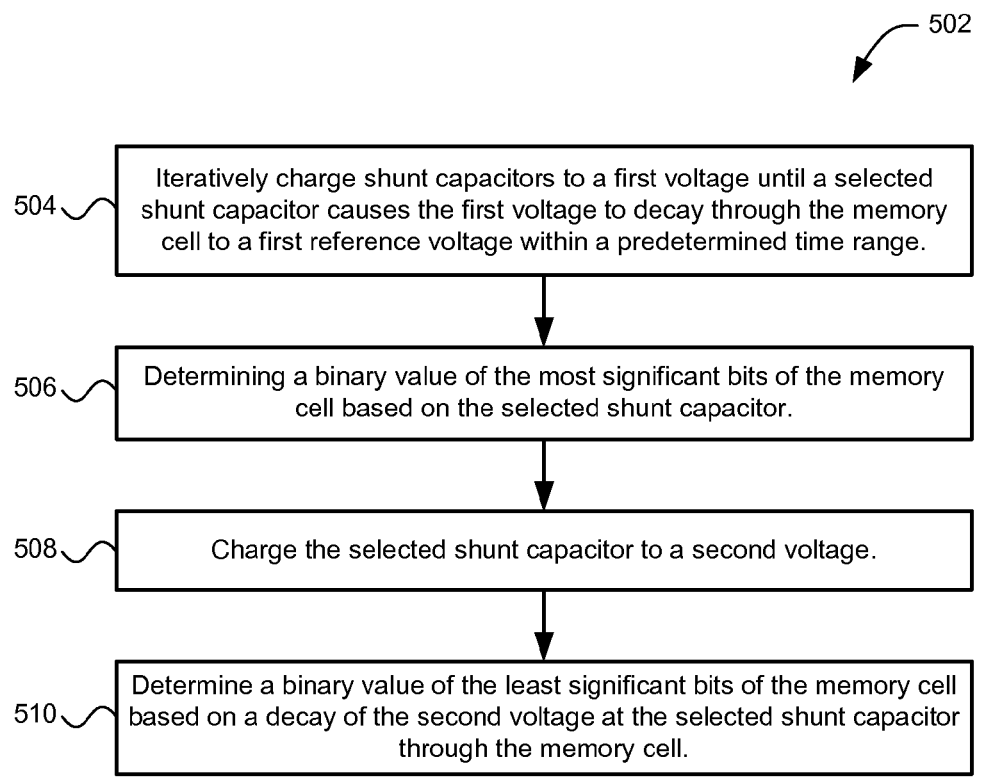
FIG. 5 illustrates an example method for determining a binary value of a memory cell, as contemplated by the present invention.

FIG. 5 illustrates an example method 502 for determining a binary value of a memory cell. As discussed above, the binary value of the memory cell is represented by an electrical resistance level of the memory cell. The binary value of the memory cell includes most significant bits and least significant bits.

The method beings at charging operation 504. During this operation, the shunt capacitors are iteratively charged to a first voltage until a selected shunt capacitor causes the first voltage to decay through the memory cell to a first reference voltage within a predetermined time range. As mentioned above, the shunt capacitors have different capacitances, and in one embodiment, the ratio between each capacitance of the shunt capacitors has a logarithmic relation.

As discussed above, iteratively charging the shunt capacitors may include counting clock pulses in a counter until the first voltage decays to the first reference voltage. In one embodiment using a fast clock signal, the selected shunt capacitor is one of the shunt capacitors having the smallest capacitance that causes the counter to overflow. In one embodiment using a slow clock signal, the selected shunt capacitor is one of the shunt capacitors having the smallest capacitance that causes the counter to underflow.

After charging operation 504 is completed, control passes to determining operation 506. During this operation, the binary value of the most significant bits of the memory cell is determined based on the selected shunt capacitor. When determining operation ends, control passes to charging operation 508.

At charging operation 508, the selected shunt capacitor is charged to a second voltage. The first voltage and the second voltage may be equal. After charging operation 508 is completed, control passes to determining operation 510.

At determining operation 510, the binary value of the least significant bits of the memory cell is determined based on the RC decay of the second voltage at the selected shunt capacitor through the memory cell. As detailed above, determining the binary value of the least significant bits may include electrically coupling the memory cell to the selected shunt capacitor such that the binary value of the least significant bits is based on a time of decay from the second voltage to a second reference voltage. This embodiment may further include counting clock pulses in a binary clock pulse count until the second voltage decays to the second threshold voltage such that the binary value of the least significant bits is based solely on a position of the highest digit of the binary clock pulse count.

In another embodiment, determining the binary value of the least significant bits may include electrically coupling the memory cell to the selected shunt capacitor and comparing the voltage at the selected capacitor to a plurality of voltage ranges at a predetermined time. For example, the LSB decoder circuit may include four sense amplifier outputs (b3, b2,b1,b0) that compare the bit line from the memory cell with four different reference voltage levels.

As will be appreciated by one skilled in the art, aspects of the invention may be embodied as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, or a magnetic storage device.

Computer program code for carrying out operations of the invention may be written in an object oriented programming language such as Java, Smalltalk, C++ or the like. However, the computer program code for carrying out operations of the invention may also be written in conventional procedural programming languages, such as the "C" programming language or similar programming languages.

The invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It should be noted that in some alternative implementations, the functions noted in a flowchart block may occur out of the order noted in the figures. For instance, two blocks shown in succession may, in fact, be executed substantially concurrently, or the blocks may sometimes be executed in the reverse order, depending upon the functionality involved because the flow diagrams depicted herein are just examples. There may be many variations to these diagrams or the steps (or operations) described therein without departing from the spirit of the invention. For example, the steps may be performed concurrently and/or in a different order, or steps may be added, deleted, and/or modified. All of these variations are considered a part of the claimed invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for determining a binary value of a memory cell, the binary value of the memory cell represented by an electrical resistance level of the memory cell, the binary value of the memory cell including most significant bits and least significant bits, the method comprising:
   iteratively charging shunt capacitors having different capacitances to a first voltage until a selected shunt capacitor causes the first voltage to decay through the memory cell to a first reference voltage within a predetermined time range;
   determining a binary value of the most significant bits of the memory cell based on the selected shunt capacitor;
   charging the selected shunt capacitor to a second voltage after determining the binary value of the most significant bits of the memory cell;
   determining a binary value of the least significant bits of the memory cell based on a decay of the second voltage at the selected shunt capacitor through the memory cell.

2. The method of claim 1, wherein iteratively charging the shunt capacitors comprises:
   counting clock pulses in a counter until the first voltage decays to the first reference voltage; and
   wherein the selected shunt capacitor is one of the shunt capacitors having the smallest capacitance that causes the counter to overflow.

3. The method of claim 1, wherein iteratively charging the shunt capacitors comprises:
   counting clock pulses in a counter until the first voltage decays to the first reference voltage; and
   wherein the selected shunt capacitor is one of the shunt capacitors having the smallest capacitance that causes the counter to underflow.

4. The method of claim 1, wherein a ratio between each capacitance of the shunt capacitors has a logarithmic relation.

5. The method of claim 1, wherein determining the binary value of the least significant bits of the memory cell includes:
   electrically coupling the memory cell to the selected shunt capacitor; and
   wherein the binary value of the least significant bits is based on a time of decay from the second voltage to a second reference voltage.

6. The method of claim 5, further comprising:
   counting clock pulses in a binary clock pulse count until the second voltage decays to the second threshold voltage; and
   wherein the binary value of the least significant bits is based solely on a position of the highest digit of the binary clock pulse count.

7. The method of claim 1, wherein determining the binary value of the least significant bits of the memory cell includes:
   electrically coupling the memory cell to the selected shunt capacitor; and
   comparing the voltage at the selected capacitor to a plurality of voltage ranges at a predetermined time.

8. The method of claim 1, wherein the first voltage and the second voltage are equal.

* * * * *